US008934248B2

(12) United States Patent
Thrailkill

(10) Patent No.: US 8,934,248 B2
(45) Date of Patent: Jan. 13, 2015

(54) THERMAL DISSIPATOR UTILIZING LAMINAR THERMAL TRANSFER MEMBER

(76) Inventor: John E. Thrailkill, Shelburne, VT (US)

( * ) Notice: Subject to any disclaimer, the term of this patent is extended or adjusted under 35 U.S.C. 154(b) by 159 days.

(21) Appl. No.: 13/124,593

(22) PCT Filed: Mar. 4, 2010

(86) PCT No.: PCT/US2010/000654
§ 371 (c)(1), (2), (4) Date: Apr. 15, 2011

(87) PCT Pub. No.: WO2011/109006
PCT Pub. Date: Sep. 9, 2011

(65) Prior Publication Data
US 2011/0267780 A1 Nov. 3, 2011

Related U.S. Application Data
(63) Continuation-in-part of application No. 12/260,661, filed on Oct. 29, 2008, now Pat. No. 7,740,380.

(51) Int. Cl.
*H05K 7/20* (2006.01)
*F21V 29/00* (2006.01)
*F21S 8/10* (2006.01)
*F21V 15/015* (2006.01)
*F21V 29/02* (2006.01)
*F21Y 101/02* (2006.01)

(52) U.S. Cl.
CPC ............ *F21V 29/004* (2013.01); *F21S 48/328* (2013.01); *F21V 29/225* (2013.01); *F21V 29/265* (2013.01); *F21V 29/262* (2013.01); *F21V 15/015* (2013.01); *F21V 29/02* (2013.01); *F21Y 2101/02* (2013.01); *Y10S 362/80* (2013.01)
USPC ...... 361/710; 361/679.54; 361/688; 361/708; 362/294; 362/547; 362/800

(58) Field of Classification Search
CPC . H01L 23/427; H01L 23/473; H01L 23/3672; H01L 23/4093; H01L 23/4006; H01L 23/467; H01I 2023/405; H01I 2023/4081; H01I 2924/14; H01I 2924/01079; H01I 2924/01014; F28F 3/02; F28F 3/12
USPC ............... 361/709, 675–678, 679.46–679.54, 361/688–722, 752, 760–762, 831
See application file for complete search history.

(56) References Cited

U.S. PATENT DOCUMENTS 3,739,234 A * 6/1973 Bylund et al. ................ 257/715
5,396,947 A * 3/1995 Itoh .......................... 165/104.14

(Continued)

FOREIGN PATENT DOCUMENTS

WO WO 2006/049086 5/2006

*Primary Examiner* — Courtney Smith
(74) *Attorney, Agent, or Firm* — Cesari and McKenna, LLP

(57) ABSTRACT

A thermal dissipator includes an elongated laminar thermal transfer member having opposite sides, opposite ends and a longitudinal axis extending between those ends. The member has a thermal conductivity along its axis and in a first plane extending between its sides that is substantially greater than the thermal conductivity of the member in a second plane transverse to the first plane. A transverse heat sink structure contacts at least one side of the thermal transfer member along the length thereof, and extends from the thermal transfer member in a direction parallel to the first plane. A compression device compresses the thermal transfer member and the heat sink structure together to establish intimate thermal contact therebetween. Solid state lighting apparatus incorporating the dissipator is also disclosed.

22 Claims, 7 Drawing Sheets

(56) References Cited

U.S. PATENT DOCUMENTS

| | | | | | |
|---|---|---|---|---|---|
| 6,019,165 | A * | 2/2000 | Batchelder | 165/80.3 |
| 6,021,844 | A * | 2/2000 | Batchelder | 165/80.3 |
| 6,330,908 | B1 * | 12/2001 | Lee et al. | 165/185 |
| 6,481,874 | B2 * | 11/2002 | Petroski | 362/373 |
| 6,851,467 | B1 * | 2/2005 | Bamford et al. | 165/80.3 |
| 6,897,486 | B2 * | 5/2005 | Loh | 257/81 |
| 6,968,890 | B1 * | 11/2005 | Ghantiwala | 165/104.21 |
| 7,142,422 | B2 * | 11/2006 | Lee et al. | 361/695 |
| 7,148,452 | B2 * | 12/2006 | Peterson et al. | 219/443.1 |
| 7,312,994 | B2 * | 12/2007 | Lee et al. | 361/700 |
| 7,399,105 | B2 * | 7/2008 | Southard et al. | 362/391 |
| 7,429,186 | B2 * | 9/2008 | Mrakovich et al. | 439/404 |
| 7,494,249 | B2 * | 2/2009 | Li | 362/294 |
| 7,621,664 | B2 * | 11/2009 | Nicolai | 362/547 |
| 7,726,840 | B2 * | 6/2010 | Pearson et al. | 362/249.06 |
| 7,841,753 | B2 * | 11/2010 | Liu | 362/373 |
| 7,861,768 | B1 * | 1/2011 | Ghantiwala | 165/104.33 |
| 7,889,502 | B1 * | 2/2011 | Reis et al. | 361/717 |
| 7,914,184 | B2 * | 3/2011 | Liu | 362/373 |
| 8,070,318 | B2 * | 12/2011 | Chen | 362/249.02 |
| 8,085,531 | B2 * | 12/2011 | Lemak et al. | 361/679.54 |
| 8,226,272 | B2 * | 7/2012 | Chen | 362/294 |
| 8,235,562 | B2 * | 8/2012 | Chen | 362/373 |
| 8,347,502 | B2 * | 1/2013 | Slaton et al. | 29/890.03 |
| 2002/0108743 | A1 * | 8/2002 | Wirtz | 165/185 |
| 2003/0116312 | A1 * | 6/2003 | Krassowski et al. | 165/185 |
| 2003/0174517 | A1 * | 9/2003 | Kiraly et al. | 362/555 |
| 2003/0183379 | A1 * | 10/2003 | Krassowski et al. | 165/185 |
| 2004/0000391 | A1 * | 1/2004 | Getz et al. | 165/80.3 |
| 2004/0001317 | A1 * | 1/2004 | Getz et al. | 361/703 |
| 2004/0177947 | A1 * | 9/2004 | Krassowski et al. | 165/104.33 |
| 2005/0013119 | A1 | 1/2005 | Misra | |
| 2005/0135093 | A1 | 6/2005 | Alexanderson et al. | |
| 2005/0190553 | A1 * | 9/2005 | Lynch et al. | 362/227 |
| 2005/0199368 | A1 * | 9/2005 | Gonzales et al. | 165/80.3 |
| 2006/0144572 | A1 * | 7/2006 | Yu et al. | 165/104.33 |
| 2006/0273137 | A1 * | 12/2006 | Chen et al. | 228/101 |
| 2007/0053168 | A1 * | 3/2007 | Sayir et al. | 361/718 |
| 2007/0279862 | A1 * | 12/2007 | Li | 361/692 |
| 2007/0279909 | A1 * | 12/2007 | Li | 362/294 |
| 2007/0285892 | A1 * | 12/2007 | Mindock et al. | 361/700 |
| 2008/0007954 | A1 * | 1/2008 | Li | 362/294 |
| 2008/0089069 | A1 * | 4/2008 | Medendorp | 362/294 |
| 2008/0158876 | A1 | 7/2008 | Thrailkill | |
| 2009/0032217 | A1 * | 2/2009 | Wayman | 165/80.3 |
| 2009/0097241 | A1 * | 4/2009 | Xu et al. | 362/234 |
| 2009/0141452 | A1 * | 6/2009 | Wayman | 361/704 |
| 2010/0064518 | A1 * | 3/2010 | Lower et al. | 29/890.039 |
| 2010/0065256 | A1 * | 3/2010 | Wilcoxon et al. | 165/104.31 |
| 2010/0326645 | A1 * | 12/2010 | Fan et al. | 165/185 |

* cited by examiner

THERMAL DISSIPATOR UTILIZING LAMINAR THERMAL TRANSFER MEMBER

CROSS-REFERENCE TO RELATED APPLICATIONS

The present application is a continuation-in-part of commonly assigned copending U.S. patent application Ser. No. 12/260,661, which was filed on Oct. 29, 2008, by John E. Thrailkill for a SOLID STATE LIGHTING APPARATUS UTILIZING AXIAL THERMAL DISSIPATION and is hereby incorporated by reference.

FIELD OF THE INVENTION

The present invention relates generally to a thermal dissipation system for conducting heat away from a heat source such as a light source, LED or LASER die, integrated circuit chip or other such sources of waste heat. It relates especially to such a system which has a comparatively low profile overall form factor.

BACKGROUND INFORMATION

High intensity light sources are widely used in projection systems, television backlights, automotive headlamps and other devices that require a relatively compact, high output light source. Some applications require a high intensity light source with limited Etendue (the product of light source area and solid-angle of light output). For these applications, the light emitting source itself must be as small as possible to achieve the highest efficiencies. Furthermore, some of these applications may have the additional requirement for a lighting device with a particular overall form factor, such as a predominately axial (long and slender) form factor, or alternatively, a comparatively low profile (thin and wide) form factor. Examples of applications that require an illumination source with limited Etendue and a particularly demanding device form factor are ultra-compact image projectors, surgical headlights and hand held light curing wands.

Generally, High Intensity Discharge (HID) lamps have been used heretofore in high intensity light sources due to their high photonic output and high photonic conversion efficiencies. In operation, however, these devices are hindered by relatively short operating lifetimes, erratic performance, catastrophic failure that can interfere with automatic or man-life dependent operations and the production of high levels of radiated and convected waste heat which can negatively affect the objects of illumination. In addition, applications that require a lighting device with a particularly compact or otherwise demanding form factor may require supplementary light guide structures, such as fiber optics, in order to locate the light source remotely, relative to the object of illumination.

As products that require light sources have become increasingly compact and in many cases more portable, the need has arisen for compact, reliable, solid state illumination sources. These sources, typically based on Light Emitting Diode (LED) technology, offer longer operating lifetimes, predictable performance, more predictable and manageable failure modes and tunable spectral output. In addition, the waste heat generated by an LED is primarily conductive in nature and with proper design, can be dissipated with little or no affect on the object of illumination.

A major shortcoming of the current state of the art of LED technology, however, is its inability to produce adequate levels of illumination in applications that require a high intensity lighting device with a particularly demanding overall form factor, such as a compact, predominately axial form factor or a compact, low profile form factor. These devices lack the required thermal dissipation mechanisms to adequately eliminate the waste heat that is being generated. This is especially true for applications that require a limited Etendue. For these applications, the LED dies must be grouped into closely spaced arrays. This close spacing results in a large thermal flux, exacerbating the thermal dissipation challenges.

Other devices which have solid state components which generate waste heat have similar thermal dissipation problems.

It is therefore a principle object of this invention to provide thermal dissipation apparatus which can dissipate waste heat from a heat source in an especially efficient manner.

Another object of the invention is to provide such apparatus which can conduct thermal energy away from a heat source in one or two preferred directions.

Still another object of the invention to provide thermal dissipation apparatus of this type that is characterized by a compact, low profile form factor.

A further object of the present invention to provide a high intensity, solid state lighting apparatus that is characterized by its ability to dissipate a high thermal flux in a minimum amount of time.

SUMMARY OF THE INVENTION

Briefly, my thermal dissipation apparatus comprises an elongated thermal transfer member having opposite sides, opposite ends and a longitudinal axis extending between those ends. The member is designed to have a thermal conductivity along its axis and in a first plane extending between these sides and transverse to that axis which is substantially greater than the thermal conductivity thereof in a second plane transverse to the first plane. Preferably, the thermal transfer member comprises a highly oriented pyrolitic graphite member composed of a plurality of generally parallel graphene layers is having edges and extending parallel to the aforesaid first plane so that those edges together form said sides and ends of the thermal transfer member.

A heat sink structure contacts at least one side of the thermal transfer member along the length thereof and a compression device presses that member and the heat sink structure together to establish intimate thermal contact therebetween. As will be described in detail later, the heat sink structure provides a window enabling a heat source such as a LED or LASER die array to be seated against a side or end of the thermal transfer member and includes a compression device to press that die array and the thermal transfer member together to establish intimate thermal contact between the two.

When the heat source is located at the end of the thermal transfer member, the heat sink structure may include a pair of heat sink components which compressively engage opposite sides of the thermal transfer member so that thermal energy from the source is dissipated primarily in an axial direction.

My apparatus is especially adapted to provide enhanced thermal dissipation of waste heat generated by lighting apparatus including a closely spaced array of LED dies to achieve a compact, predominantly axial form factor or, alternatively, a compact, low profile form factor. To aid in the description of the present invention in that context, the components that comprise the lighting apparatus are segregated into two main groups, the Internal and External Component Groups. The primary function of the Internal Component Group is to generate light and dissipate the resulting waste heat. The primary function of the External Component Group is to evacuate the waste heat into the ambient environment and to create and maintain thermal contact with the internal components and to protect the internal components from damaging external forces.

The Internal Component Group is generally comprised of the following: a Light Emitting Diode (LED) die array and circuit structure assembly (the LED die array being affixed to the component side of the circuit structure), a reflecting optic element, a laminar thermal transfer member and a transverse heat sink structure (transversely is mounted to that member).

The External Component Group is generally comprised of the following: an exterior housing (a set of exterior half-shells, an exterior top plate and an exterior bottom plate), a system of transverse compression pads, an axial compression spring and spring clamp and, optionally, an axial flow fan (or other type of forced convection device).

Elements of the Internal Component Group operate as a system in the following way: light generated by the LED die array is focused and projected by the reflecting optic element (said the optic element being affixed to the component side of the LED die array and circuit structure assembly). Waste heat generated by the LED die array is spread throughout the thermally conductive circuit structure and into an end face of the laminar thermal transfer member (the end face being in physical contact with the underside of the circuit structure).

As waste heat is conducted into the end face of the thermal transfer member, the very high thermal transfer rate within the plane of the graphene thermal layers results in a rapid transfer of waste heat down the length of the axial member, and simultaneously, into the transversally mounted transverse heat sink structure, where the waste heat is further diffused throughout the heat sink structure (the heat sink structure being in physical contact with two opposed, axially aligned sides of the thermal transfer member).

This thermal transfer system is preferably designed to operate in conjunction with an axial flow fan (or other type of forced convection device) as part of an active, forced convection cooling system, whereby a fluid medium, in the present case air, is forced through the transverse heat sink structure, thereby convectively evacuating the waste heat into the ambient environment.

The axial flow fan (or other type of forced convection device) is an element of the broader External Component Group. Other elements of this group operate in conjunction with the Internal Component Group in the following way: with the transverse compression pads adhered to the inside surfaces of the two outer housing shells, the housing shells are brought together around the Internal Component Group such that a transverse compression load is developed between the thermal transfer member and the transverse heat sink structure (the compression load being applied in the plane of the graphene layers and transverse to the main axis of the thermal transfer member). So arranged, the housing shells are affixed in position with mechanical fasteners. With the top end plate fastened to the housing shells, the axial compression spring and spring clamp are assembled into the housing shell such that an axial compression load (coaxial with respect to the main axis of the thermal transfer member) is developed between the thermal transfer member and the LED die array and circuit structure assembly (with the reflecting optic element acting as a mechanical stop between the circuit structure assembly and the top end plate). So arranged, the bottom end plate and axial flow fan (or other type of forced convection device) are mechanically fastened to the housing shell.

In this way, the External Component Group serves to create and maintain a high degree of thermal contact between the LED die array with its circuit structure assembly and the thermal transfer member and the transverse heat sink structure. In addition, it serves to evacuate waste heat from said transverse heat sink structure into the ambient environment and to protect the Internal Component Group from damaging external forces.

The foregoing and other objects, features and advantages of the present invention will become readily apparent to those skilled in the art from the following detailed description wherein embodiments of the invention are shown and described by way of illustration. As will be realized, the invention is capable of other and different embodiments and its several details may be capable of modifications in various aspects, all without departing from the scope of the invention as defined by the appended claims. Accordingly, the drawings and description are to be regarded as illustrative in nature and not in a restrictive or limiting sense, with the scope of invention being defined by the claims.

DETAILED DESCRIPTION OF ILLUSTRATIVE EMBODIMENTS

Figure 1:
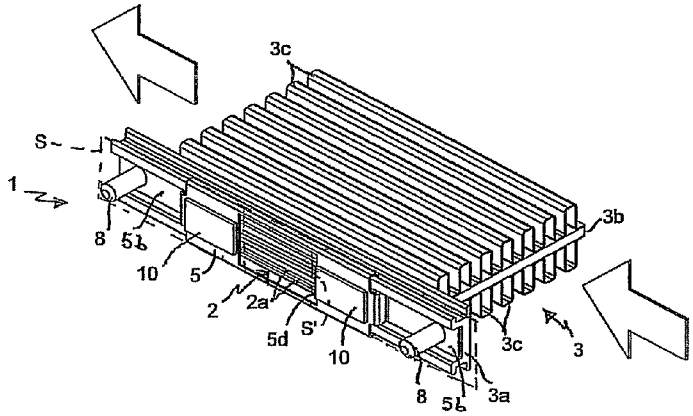
FIG. 1 is a perspective view from the front of a thermal dissipator embodying the invention.
Figure 2:
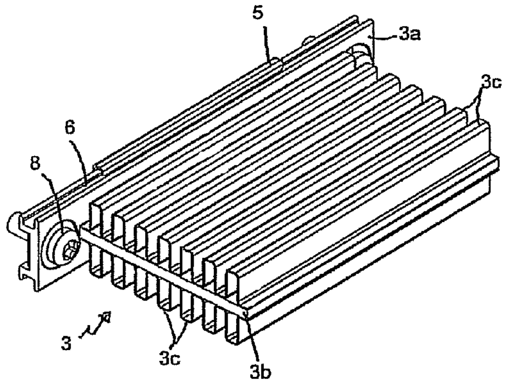
FIG. 2 is a similar view from the rear thereof.
Figure 3:
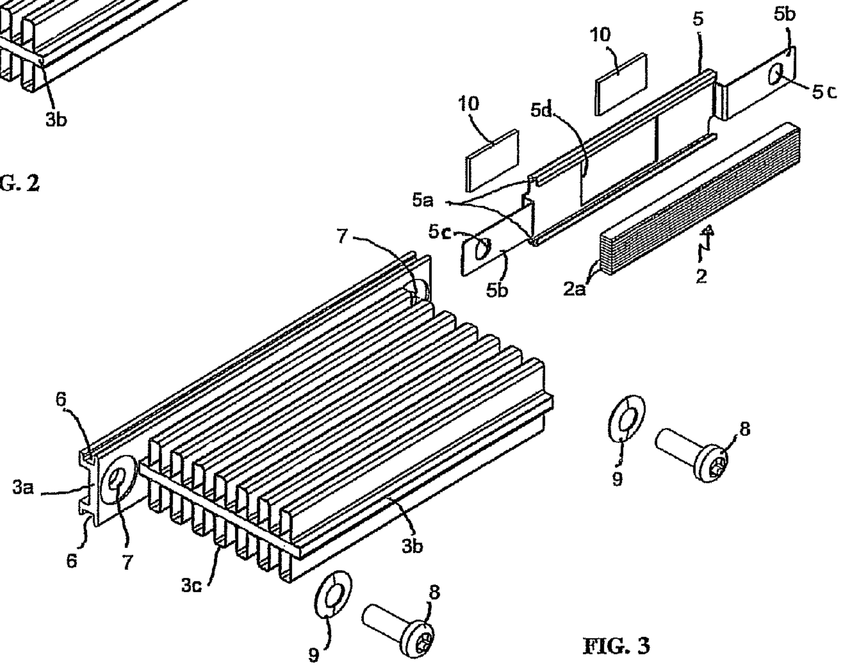
FIG. 3 is an exploded perspective view thereof.

Refer now to FIGS. 1-3 of the drawings which show a thermal dissipator 1 incorporating the invention. The dissipator comprises a thermal transfer member shown generally at 2 which is supported by a transverse heat sink structure indicated generally at 3 made of a highly thermally conductive material such as aluminum, copper, conductive plastic or the like. It includes an elongated channel 3*a* in which the member 2 is seated. Extending transversely from the back of the channel is a flat plate 3*b*, the channel and plate together forming a unitary base. Projecting from the opposite faces of the plate 3*b* is a plurality of spaced-apart fins 3*c* which extend parallel to channel 3*a*. The fins at each face of plate 3*b* are formed from a conductive sheet steeply corrugated to form a series of peaks and valleys, the valleys being welded to the adjacent face of plate 3*b* or adhered thereto using a thermally conductive epoxy cement or the like.

As best seen in FIG. 3, the thermal transfer member 2 is rectangular in cross section, i.e. a rectangular parallelepiped, and is constructed of Highly Oriented Pyrolytic Graphite (HOPG), a material comprised of a plurality of parallel graphene layers 2*a*. HOPG is characterized as highly thermally anisotropic, exhibiting very high thermal conductivity (on the order of 1500 Watts/Meter·Kelvin) along the plane of the graphene layers extending between their side edges (the first plane), while exhibiting relatively low thermal conductivity (on the order of 25 Watts/Meter·Kelvin) in a second plane transverse to the first plane. The illustrated member 2 is in the order of 8 mm tall, 1.5 mm deep and 38 mm long. However, the specific dimensions of the thermal transfer member 2 may vary depending upon the particular application.

Due to its laminar construction, the thermal transfer member 2 is thus characterized by a high thermal conductivity along the longitudinal axis of the member as well as in a transverse direction extending between the sides of the member and perpendicular to that axis. As shown in FIG. 1, member 2 is seated in channel 3*a* so that its layers 2*a* are substantially parallel to plate 3*b* of the heat sink structure 3 and side edges of the layers 2*a* of member 2 face forwardly as shown in FIG. 1.

Referring to FIGS. 1-3, member 2 may be releasably retained in channel 3*a* by a bracket 5 in the form of a slider having upper and lower flanges 5*a*, 5*a*, which slide along upper and lower grooves 6, 6 in channel 3*a*. Bracket 5 also has ears 5*b* extending from the ends of the bracket formed with slots 5*c*, 5*c*, which, when bracket 5 is centered along channel 3*a*, are in register with holes 7, 7 in channel 3*a*. When the bracket 5 is centered thusly, a window 5*d* in the bracket exposes a center span of the laminar thermal transfer member 2 as shown in FIG. 1. Bracket 5 may be releasably retained in its centered position by fasteners 8, 8 carrying disk springs 9, 9. Preferably, slots 5*c*, 5*c* in bracket ears 5*b*, 5*b* are slightly undersized so when the fasteners 8, 8 are pushed through the slots via holes 7, 7, the thermal transfer member 2 is releasably secured and compressed to some extent between bracket 5 and channel 3*a* so that member 2 is in intimate thermal contact with the latter. A pair of resilient pads 10, 10 may be adhered to the front of bracket 5 adjacent the opposite ends of window 5*d* therein for reasons to be described presently.

In use, a heat source S shown in phantom in FIG. 1 may be secured to the front of the heat sink structure 3 utilizing fasteners 7, 7 so that the heat generating component S' thereof, e.g. a LED or laser die array or integrated circuit chip, is centered in the window 5*d* as shown in FIG. 1. Source S may be secured to the heat sink structure 3 by means of nuts (not shown) turned down on the threaded shanks of fasteners 8, 8. Upon such assembly, the compression pads 10, 10 are compressed to the point that the underside of the heat generating component S' just comes into contact with the side segment of thermal transfer member 2 exposed in window 5*d*. During this process, the opposite side of member 2 is pressed more tightly against the channel 3*a* of the heat sink structure 3. Once member 2 is compressed between source S and the channel, the disk springs 9, 9 on fasteners 8, 8 begin to compress, providing mechanical loading between source S and heat sink structure 3 via the thermal transfer member 2.

It should be mentioned here that it is a characteristic of the pyrolytic graphene material comprising the thermal transfer member 2 that the material is mechanically conformable. Resultantly, no thermal interface material is required to be placed between that member and the channel 3*a* or the heat generating component S' of the heat source S. In other words, when member 2 is compressed between component S' and the channel 3*a*, intimate thermal contact is automatically established between those parts.

The FIGS. 1-3 embodiment of the dissipator is especially suitable, for example, to dissipate heat from an array of LED or LASER dies utilized in a miniature light projector, sometimes referred to as a PICO projector.

When the heat generating component S' of source S is generating heat, that heat is conducted preferentially along the axis of member 2 and along the plane between that member's sides (the first plane) and perpendicular to that axis, i.e. horizontally, toward the plate 3*b* of the heat sink structure 3 in FIG. 1. Considerably less heat is conducted in a direction perpendicular to that plane, i.e. vertically in FIG. 1. The heat in base 3*b* is, in turn, dissipated by the fins 3*c* of the heat sink structure 3. Preferably, a fan is provided to force air axially through those fins as shown by the arrows in FIG. 1 to increase the heat dissipation efficiency of the thermal dissipator 1. Such a fan is shown at 17 in FIG. 13.

Figure 4:
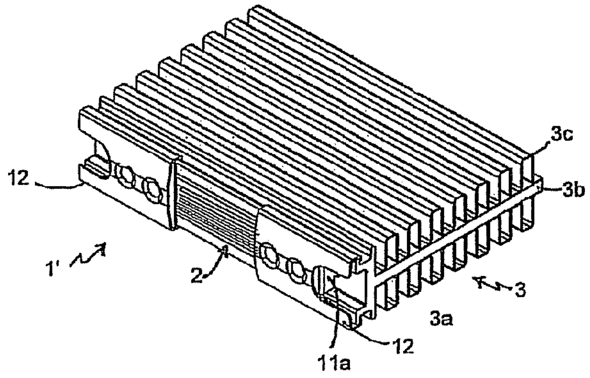
FIG. 4 is a view similar to FIG. 1 of a second embodiment of the thermal dissipator.
Figure 5:
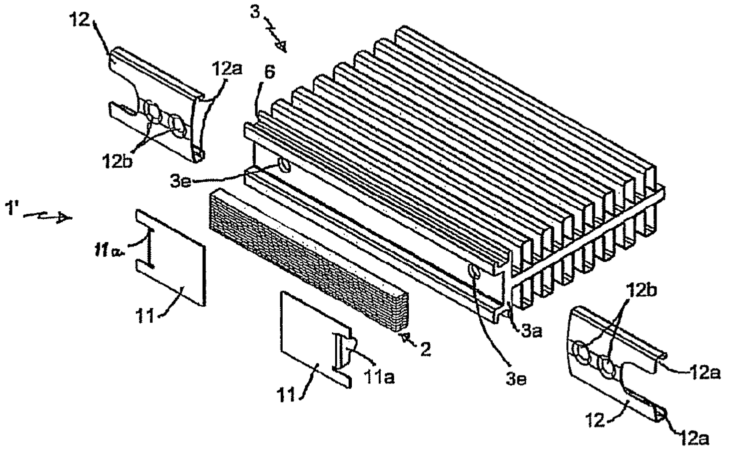
FIG. 5 is an exploded perspective view thereof.

Refer now to FIGS. 4 and 5 which illustrate a second dissipator embodiment 1' whose channel 3*a* is devoid of end extensions and which is somewhat more compact and self-contained than dissipator 1 as concerns transverse compression loads between the member 2 and the heat sink structure 3. It does, however, require an external force to provide compression loading between a mating heat source S and the thermal transfer member. The components of this embodiment that are similar to those found in the FIG. 1 dissipator embodiment carry the same identifying numerals.

In dissipator 1', the laminar thermal transfer member 2 is secured to the heat sink structure 3 by seating the member in the channel 3*a* and placing two sheet metal wear plates 11, 11 over member 2 so that inwardly projecting tabs 11*a*, 11*a* on those plates engage the ends of member 2 and project into holes 3*e* at the bottom of channel 3*a*. This centers member 2 along the channel and exposes a center segment or span of that member in the window between the two wear plates 11, 11.

A pair of slider clips 12, 12 are slid on to the opposite ends of the channel 3*a* with is upper and lower flanges 12*a*, 12*a* of those clips sliding along the grooves 6, 6 in the channel until the clips overlie the wear plates 11, 11. The clips are deflected outwardly due to interferences between interior bumps 12*b*, 12*b* on the clips and the wear plates 11, 11. This deflection provides mechanical loading between member 2 and the heat sink structure 3 to establish good thermal contact between the two.

Just as in the FIG. 1 embodiment, a heat source S may be secured to the front of dissipator 1' by suitable means, e.g. a clamp, so that the heat generating component S' thereof contacts the exposed side of member 2 under a sufficient compressive load so as to establish intimate thermal contact between component S' and member 2.

Figure 6:
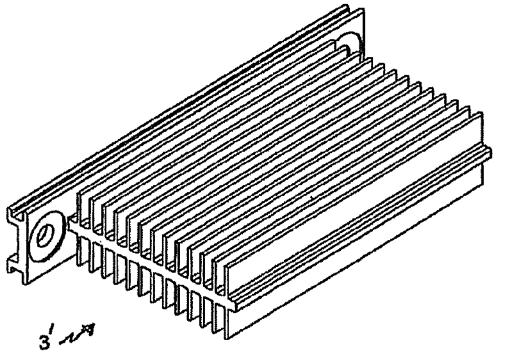
FIG. 6 is a perspective view of an alternative heat sink structure for use in the FIGS. 1 and 4 dissipator embodiments.

As shown in FIG. 6, instead of making the heat sink structure 3 with corrugated fins as shown in FIGS. 1-5, the channel, plate and fins may be formed as a unitary part 3' extruded or molded of a suitable metal or conductive plastic material.

Refer now to FIGS. 7-10 and FIG. 13 which illustrate a high intensity solid state lighting apparatus incorporating a thermal dissipator in accordance with the invention, which compress the heat source and thermal transfer member axially instead of transversely as in the apparatus depicted in FIGS. 1-5.

Figure 14:
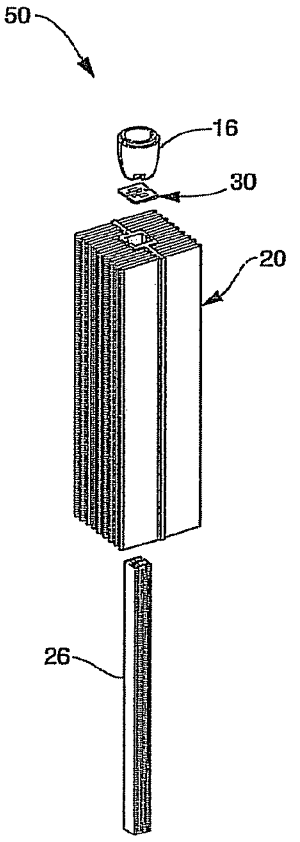
FIG. 14 is a partially exploded view of the components and assemblies that comprise the Internal Component Group of the FIG. 7 apparatus.
Figure 15:
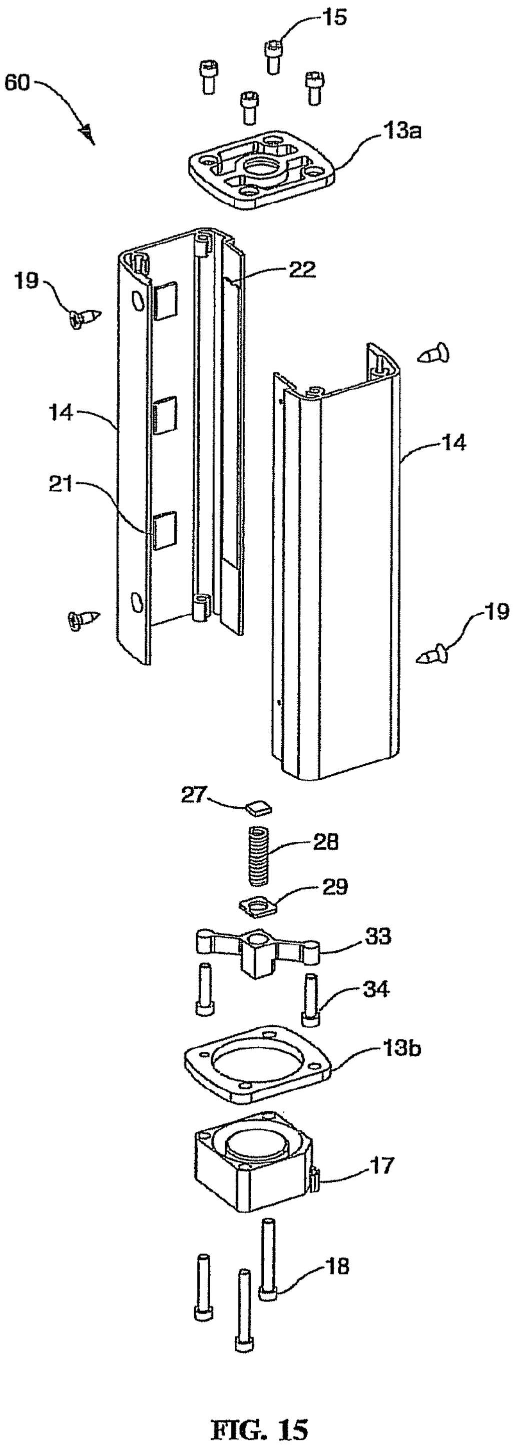
FIG. 15 is a partially exploded view showing the components that comprise the External Component Group of the FIG. 7 apparatus.

This lighting apparatus is generally comprised of two functional component groups, the internal component group 50 (shown in FIG. 14) and the external component group 60 (shown in FIG. 15). These component groups contribute to the functioning of the lighting apparatus in the following ways: the internal component group 50 serves to generate light and to dissipate the resulting waste heat into an internal structure; the external component group 60 serves to transfer the waste heat away from the internal structure and into the ambient environment; the external component group 60 also serves to create and maintain thermal contact between the parts and assemblies that comprise the internal component group 50 and to protect the internal components from damaging external forces.

The internal component group 50 is comprised of the following parts and assemblies: a LED die array and circuit structure assembly 30, a reflecting optic element 16, a laminar thermal transfer member 26 similar to member 2 in FIG. 1 except perhaps for its dimensions, and the transverse heat sink structure 20.

Figure 11:
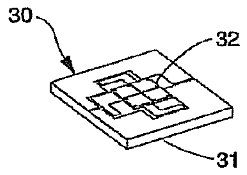
FIG. 11 is a perspective view of the LED die array and circuit structure assembly in the FIG. 7 apparatus.

Elements of the internal component group 50 operate as a system in the following way: the LED die array and circuit structure assembly 30 (shown in FIG. 11) is an assemblage of an LED die array 32 and a circuit structure 31. The LED die array 32 is affixed to the circuit structure 31 utilizing a die attachment process, commonly known in the art, such as silver-epoxy bonding or eutectic soldering. The circuit structure 31, commonly known in the art, is comprised of a thermally conductive, dielectric ceramic substrate with electrically conductive metallic layers adhered to the top (component) side of the substrate.

The LED die array 32 consists of four individual LED dies placed adjacent to each other on the circuit structure 31, with the placement resulting in a square array. The LED dies are placed as closely to each other as is practical within the limits of the die placement and die attachment processes. However, they are not placed so close as to cause electrical shorting between adjacent dies.

The present embodiment of the invention utilizes an LED die known in the art as a vertically structured die. Vertical structure refers to the current flow in the LED dies; electrical current flows vertically upwards from a bottom surface anode through the device and out to cathode wire bond termination pads on the top surface. Wire bonding is an electrical interconnect technology commonly known in the art.

In other embodiments, an LED die with the anode and cathode termination pads both mounted on the top surface, may be employed. A lighting apparatus utilizing this type of die would require a different circuit structure design.

The circuit structure 31 is duly constructed to provide solder termination pads for the soldering of wire leads as supplied by a suitable external power supply device (not shown). These soldered wire terminations provide electrical interconnection between the LED die array and circuit structure assembly 30 and the external power source. The circuit structure 31 is also duly constructed to provide termination pads for wire bonding. These wire bonds provide electrical interconnection between the LED die array 32 and the circuit structure 31.

Figure 13:
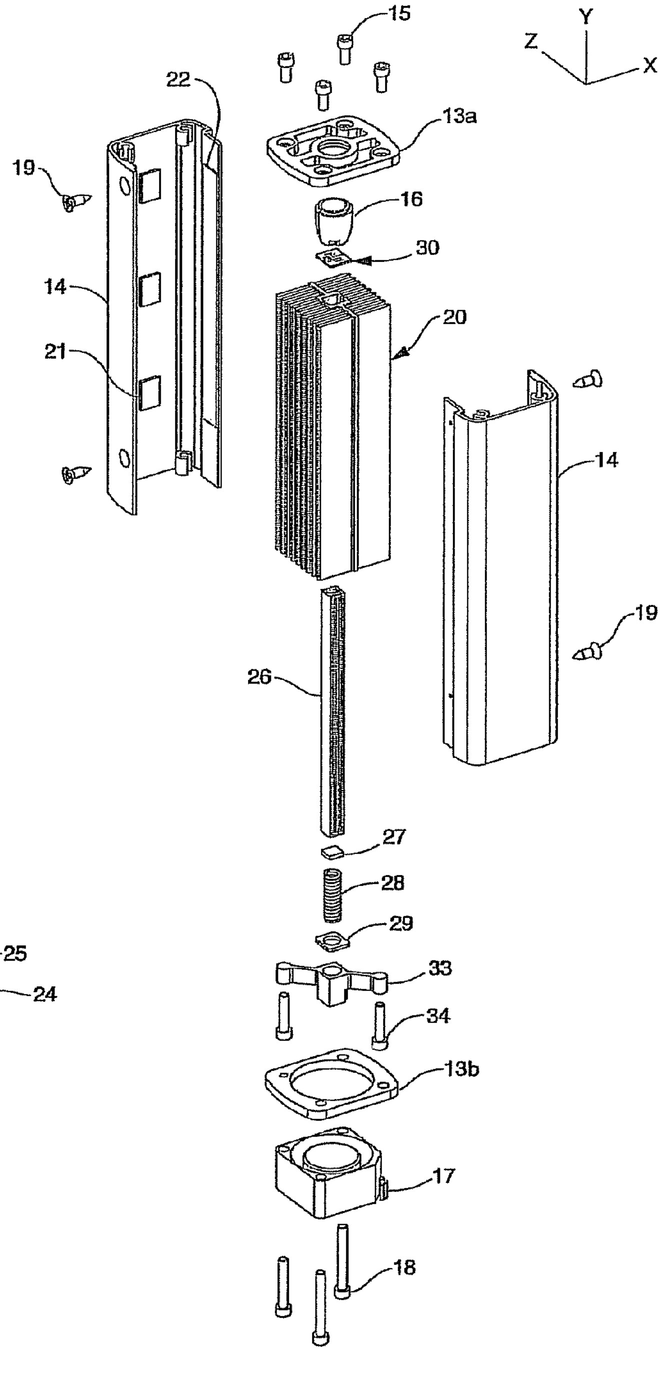
FIG. 13 is an exploded perspective view showing the components of the high intensity solid state lighting apparatus of FIG. 7.

In the embodiment being described, the reflecting optic element 16 (shown in FIGS. 7-10 and FIGS. 13 and 14) is characterized as a first-surface reflector where the reflective surface is formed as a surface of revolution (being revolved about an axis in the Y direction, as seen in FIG. 13). The reflecting optic element 16 is designed to collimate the light emanating from the LED die array 32, and belongs to a class of paraboloid reflectors well known in the art.

In other embodiments, a variety of optical reflector designs may be employed to provide a range of illumination solutions. For instance, an ellipsoidal reflector may be used to focus the light, emanating from the LED die array 32, to a point a short distance from the end of the reflecting optic element 16.

In a preferred embodiment of my lighting device, the reflecting optic element 16 is formed through the mating of two identical component halves, such that the components mate along the XY plane. This design approach presents the advantage of being able to form component geometries that would be impossible otherwise.

The reflecting optic element 16 can be produced utilizing a number of fabrication processes commonly known in the art. For example, injection molding of engineering thermoplastics can be utilized with an additional metallizing process and machining of various metals can be employed with an additional polishing process. Appropriate metallizing processes include vacuum deposition of aluminum and electroplating of various metals, depending upon the need.

In another embodiment of the same lighting device, the reflecting optic element 16 is alternatively formed as a single component.

To mechanically affix the reflecting optic element 16 to the LED die array and circuit structure assembly 30, an electrically insulating, thermally stable adhesive system is used to bond the optic element and the circuit structure assembly together.

During operation, waste heat generated by the LED die array 32 is conducted into, and spread laterally throughout, the thermally conductive circuit structure 31. The waste heat is subsequently conducted into an end face of the axial thermal transfer member 26, the end face being in physical contact with the underside of the circuit structure 31. The aforementioned lateral spreading of waste heat throughout the circuit structure 31 (in particular, in the direction parallel to the Z axis, as seen in FIG. 13) is critical to the is efficient transfer of the waste heat into the thermal transfer member 26 due to that member's low thermal conductivity in the direction parallel to the X axis, as explained in more detail below.

As waste heat from LED diode 32 is conducted into the end face of the axial thermal transfer member 26, the very high thermal conductivity within the planes of the graphene layers (parallel to the YZ plane, as seen in FIG. 13), results in a rapid transfer of waste heat down the length of the axial member and simultaneously out to opposite sides (sides parallel to the XY plane) of the axial thermal transfer member 26. The waste heat is subsequently conducted into the transverse heat sink structure 20 (the heat sink structure being in physical contact with the two sides of the axial thermal transfer member 26 that are parallel to the XY plane) where it can be further diffused throughout the entire transverse heat sink structure 20, as described below.

Figure 12:
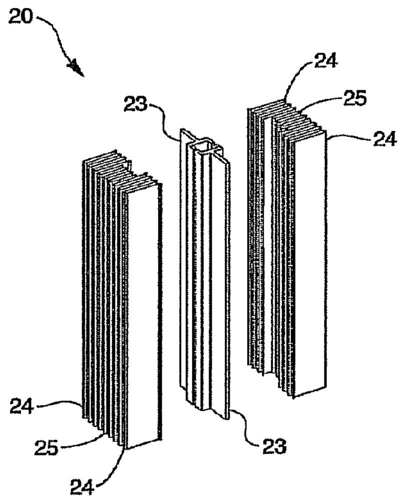
FIG. 12 is an exploded view of a transverse heat sink structure exhibiting a predominately axial form factor incorporated in the FIG. 7 apparatus.

In a preferred embodiment of the present invention, the transverse heat sink structure 20 (see FIG. 12) is formed as an assemblage of the following components: two each of a heat sink base 23, four each of an outer folded-fin component 24 and two each of an inner folded-fin component 25.

The heat sink base 23 is fabricated from aluminum utilizing an aluminum extrusion process, a process commonly known in the art. The heat sink base 23 is comprised of a three sided channel section and a transversely oriented rib section (transverse to the lengthwise axis of the channel section, see FIG. 12). The outer folded-fin components 24 and inner folded-fin components 25 are fabricated from aluminum or copper, depending upon the need, utilizing a corrugation or folded-fin process, a process also commonly known in the art, where a continuous sheet metal strip is folded repeatedly in a pleat-like fashion so as to form a corrugated fin structure. The valley or base ends of the four outer folded-fin components 24 and the base ends of the two inner folded-fin components 25 are soldered to the two heat sink bases 23 resulting in the transverse heat sink structure 20 (as seen in FIG. 13). As an alternative to soldering, a bonding process utilizing a thermally conductive epoxy (or other appropriate adhesive system) can be used to attach the folded-fin components to the heat sink bases.

In an alternative embodiment of the present invention, a bonded-fin fabrication process, a process that is also commonly known in the art, is utilized to form a transverse heat sink structure comprised of a pair of grooved aluminum or copper heat sink bases (the heat sink bases being formed with grooved outer surfaces) and a plurality of aluminum or copper thermal dissipation fins, in sheet form. The alternative transverse heat sink structure is formed when the plurality of thermal dissipation fins are adhesively bonded, or soldered, into the grooves formed in the aforementioned heat sink bases.

In another alternative embodiment of the present invention, a known extrusion process may be utilized to form a transverse heat sink structure, e.g. of aluminum or copper, comprised of a pair of integrated base-fin structures, where the integrated base-fin structures are formed as a single component during the extrusion process; see FIG. 6.

In another alternative embodiment of the present invention, an injection molding process, a process also commonly known in the art, is utilized to form a transverse heat sink structure comprised of a pair of integrated base-fin structures, where the integrated base-fin structures are formed as a single component during the injection molding process. The material used to create the transverse heat sink is of a special class of thermally conductive, thermoplastic compounds, commonly known in the art. Such thermoplastic compounds are typically comprised of metallic particles dispersed into a thermoplastic matrix.

Figure 16:
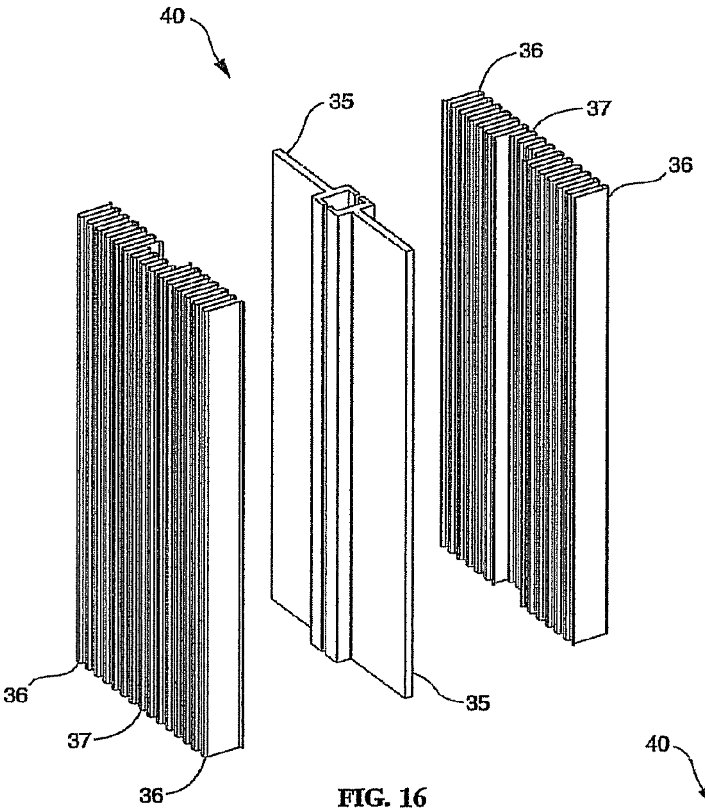
FIG. 16 is a exploded perspective view showing the components of a transverse heat sink structure exhibiting a comparatively low profile form factor in accordance with the present invention.
Figure 17:
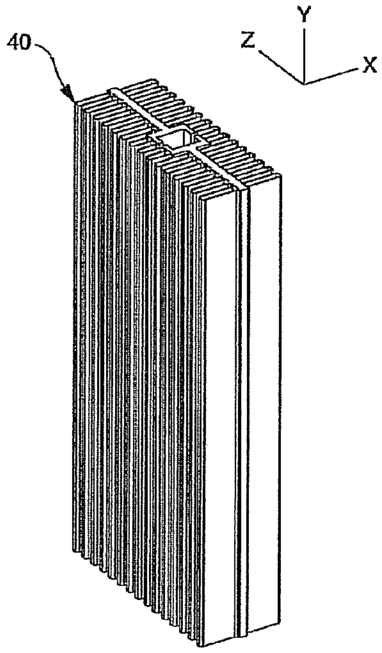
FIG. 17 is a perspective view of the FIG. 16 transverse heat sink structure fully is assembled.

In another embodiment of the present invention, the aspect ratio (width over thickness) of the transverse heat sink structure 20 is altered to produce a low profile (thin) version of the heat sink structure, namely the low profile transverse heat sink structure 40 (see FIGS. 16 and 17). The low profile transverse heat sink structure 40 is formed as an assemblage of the following components: two each of a low profile heat sink base 35, four each of a low profile outer folded-fin component 36 and two each of a low profile inner folded-fin component 37.

The alteration to the transverse heat sink structure 20 shown in FIGS. 16 and 17 is achieved by elongating (in the Z direction) the transversally oriented rib section of the heat sink base 23, resulting in the low profile heat sink base 35. In a similar fashion, the inner folded-fin component 25 and the outer folded-fin component 24 are shortened (in the X direction), resulting in the low profile inner folded-fin component 37 and the low is profile outer folded-fin component 36. This embodiment provides similar thermal dissipation performance to that of the transverse heat sink structure 20 while providing the desired low profile form factor.

As described previously, waste heat originally generated by the LED die array 32 is transferred outwardly from opposite sides (sides parallel to the XY plane) of the axial thermal transfer member 26 into the pair of heat sink bases 23 where the waste heat is first conducted into the three sided channel sections and then into the transversely oriented rib sections. The three sided channel sections serve to conduct heat into the inner folded-fin components 25, while the transversely oriented rib section serves to conduct heat into the outer folded-fin components 24. In this way, waste heat generated by the LED die array 32 is rapidly dissipated throughout the transverse heat sink structure 20.

As previously described, the external component group 60 operates in conjunction with the internal component group 50 in the following ways: it creates and maintains thermal contact (both transverse and axial) between the components that comprise the internal component group 50; it protects the internal components from damaging external forces (both transverse and axial) and it evacuates waste heat from the transverse heat sink structure 20 into the ambient environment.

In a preferred embodiment of the present invention, the external component group 60 (shown in FIG. 15) is comprised of the following components: an exterior housing, in and of itself comprised of two each of an exterior half-shell 14, four each of a half-shell fastener 19, an exterior top plate 13*a*, four each of a top plate fastener 15, an exterior bottom plate 13*b* and three each of a bottom plate fastener 18; six each of a transverse compression pad 21 (comprised of an adhesive backed elastomeric material), two each of a transverse heat sink spacer 22 (comprised of an adhesive backed elastomeric material), an axial compression load system, in and of itself comprised of an axial compression plate 27, an axial compression spring 28, an axial compression pad 29 (comprised of an elastomeric material), an axial compression clamp 33 and two each of an axial compression fastener 34; and an air flow fan 17.

Elements of the external component group 60 operate in conjunction with the internal component group 50 in the following way: with the six transverse compression pads 21 adhered to the inside surfaces of the exterior half-shells 14 (surfaces parallel to the XY plane, see FIG. 7) and with the two transverse heat sink spacers 22 adhered to the appropriate inside surfaces of the exterior half-shells 14 (surfaces parallel to the YZ plane), the exterior shells are brought together around the internal component group 50 such that a transverse compression load (applied through the central axis of the transverse heat sink structure 20, parallel to the YZ plane) is developed between the exterior half-shells 14, the transverse compression pads 21, the transverse heat sink structure 20 and the axial thermal transfer member 26, insuring that sufficient thermal contact is created between the transverse heat sink structure 20 and the axial thermal transfer member 26.

So arranged, the exterior half-shells 14 are fastened to each other with the four half-shell fasteners 19 (see FIGS. 1 and 2). Secured in this way, the two exterior half-shells 14 form a single, tubular structure around the internal component group 50, thereby maintaining thermal contact (transversally oriented) between the transverse heat sink structure 20 and the axial thermal transfer member 26 while protecting said internal component group from transversely oriented external forces (transverse to the central axis of the axial thermal transfer member 26).

The external component group 60 also protects the internal component group 50 from axially oriented external forces, as well as serving to create and maintain thermal contact (axially oriented) between the LED die array and circuit structure assembly 30 and the axial thermal transfer member 26. This is achieved by utilizing the remaining exterior housing components, the exterior top plate 13*a*, the top plate fasteners 15, the exterior bottom plate 13*b* and the bottom plate fasteners 18, along with an axial compression load system, as described in more detail below.

With the exterior half-shells 14, the transverse compression pads 21 and the transverse heat sink spacers 22 secured around the internal component group 50, as previously described, the exterior top plate 12 is fastened to the exterior half-shells 14 with the top plate fasteners 15.

Subsequently, an axial compression load system, comprised of the axial compression plate 27, the axial compression spring 28, the axial compression pad 29, the axial compression clamp 33 and the two axial compression fasteners 34 is assembled into the partial exterior housing assembly (partial in that the exterior bottom plate 13*b* is yet to be assembled) in the following way: the axial compression plate 27 is inserted into a channel in the transverse heat sink structure 20 that has been formed by the three sided channel sections of the heat sink bases 23, such that the axial compression plate 27 is placed against the end face of the axial thermal transfer member 26. The end of the axial compression spring 28 is then placed into the channel, such that the end of the axial compression spring 28 is placed against the axial compression plate 27. The axial compression pad 29 is placed around the axial compression spring 28 and against the end face of the transverse heat sink structure 20 (the end face being formed by the three sided channel sections of the heat sink bases 23). The axial compression clamp 33 is placed over and around the axial compression spring 28 (there being a pocket in the axial compression clamp). The axial compression spring 28 is compressed by a translation of the axial compression clamp 33 (in the Y direction) such that the outer arms of the axial compression clamp 33 are made to clear the axial clamp fastener retention features in the exterior half-shells 14 (see FIG. 4). The axial compression clamp 33 is then rotated (about the central axis of the axial thermal transfer member 26) and released such that the outer arms of the axial compression clamp 33 are aligned with the axial clamp fastener retention features in the exterior half-shells 14. The two axial compression fasteners 34 are then threaded into the axial clamp fastener retention features in the exterior half-shells 14 such that the axial compression clamp 33 is forced away from said axial clamp fastener retention features, thereby compressing the axial compression spring 28 and the axial compression pad 29.

This axial compression loading serves two purposes. It eliminates axial end play between the internal component group 50 and the exterior top plate 13*a* and it eliminates axial end play between the axial thermal transfer member 26 and the LED die array and circuit structure assembly 30. The axial compression loading thereby insures sufficient thermal contact between the axial thermal transfer member 26 and the LED die array and circuit structure assembly 30.

So arranged, the exterior bottom plate 13*b* and the air flow fan 17 are fastened to the exterior half-shells 14 with the three bottom plate fasteners 18.

Figure 7:
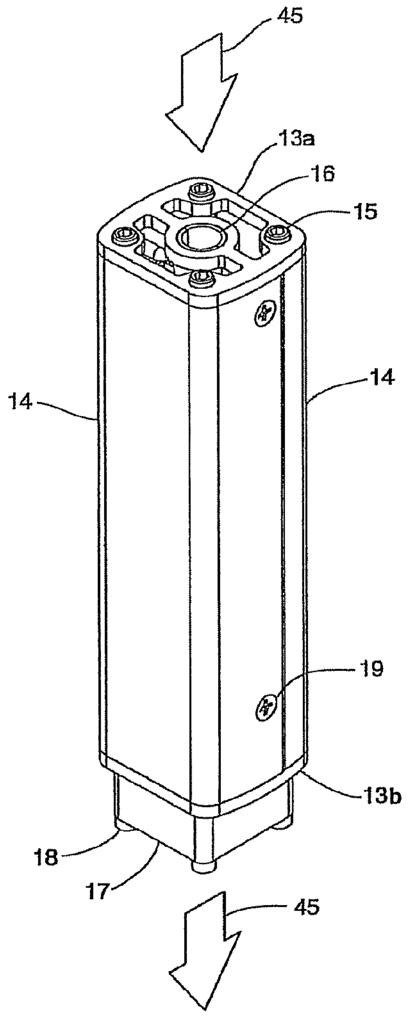
FIG. 7 is a perspective view of a high intensity solid state lighting apparatus employing a thermal dissipator in accordance with the present invention.
Figure 8:
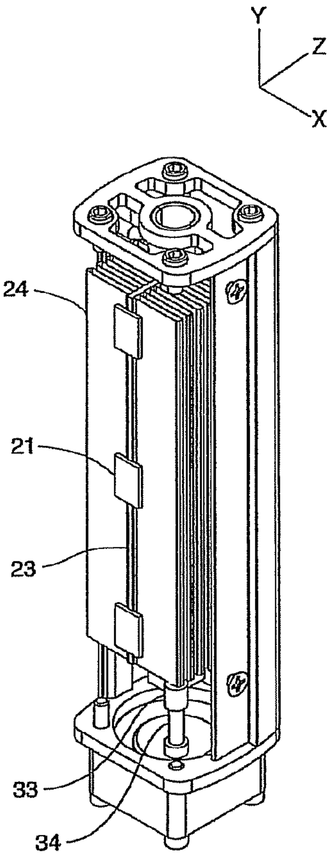
FIG. 8 is a modified perspective view (a cover has been removed to expose internal components) of the FIG. 7 apparatus.
Figure 9:
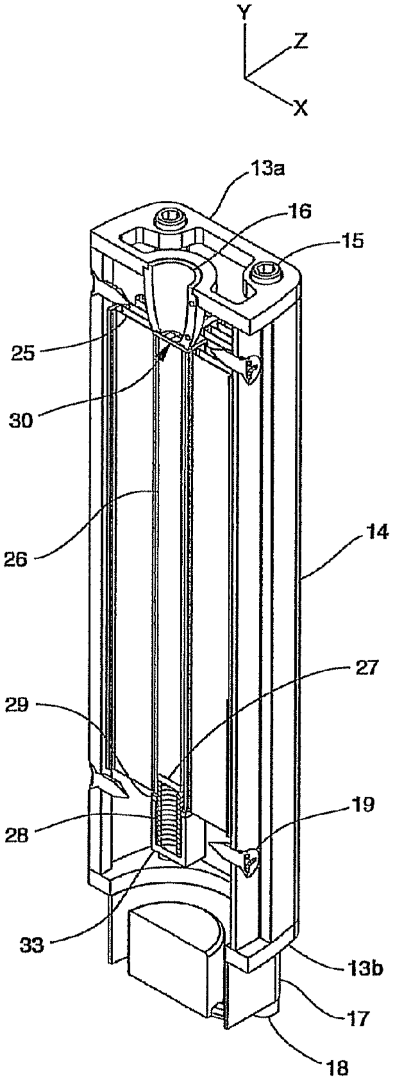
FIG. 9 is a modified perspective view (vertically sectioned), on a larger scale, of the FIG. 7 lighting apparatus.
Figure 10:
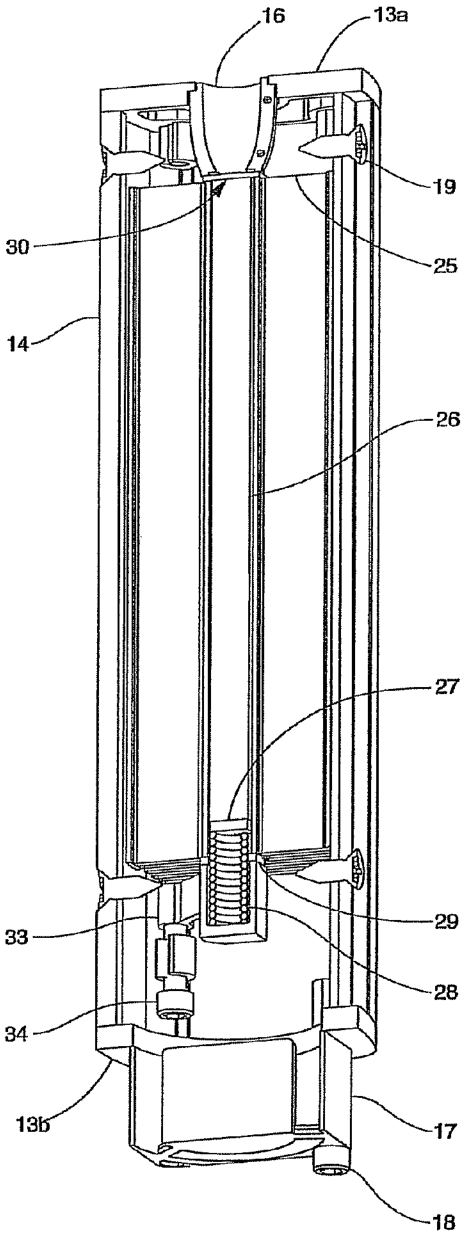
FIG. 10 is a modified version of FIG. 9 (rotated and further enlarged for clarity)

The fan 17 is part of an active, forced convection cooling system, whereby a fluid medium, in the present case air, is forced through the transverse heat sink structure 20 out into the ambient environment, as shown by the direction arrows 45 in FIG. 7.

In this way, the external component group 60 serves to evacuate waste heat from the transverse heat sink structure 20 into the ambient environment and to protect the internal component group 50 from damaging external forces.

In another embodiment of the present invention, the high intensity solid state lighting apparatus in FIG. 7 could be integrated into a broader purpose device (e.g. an image projector) by integrating the external component group 60, or a group of components that provide the functioning thereof, into the broader purpose device.

In other embodiments of the present invention, the evacuation of waste heat from the described high intensity solid state lighting apparatus could be achieved by means other than forced convection, as outlined heretofore. Other methods include: liquid cooling, dual phase, closed loop cooling (e.g., heat pipes) and passive convection cooling.

These other means of thermal transfer are commonly known in the art and are mentioned here so as not to limit the present invention to a single method of waste heat dissipation.

What is claimed is:

1. A thermal dissipation apparatus comprising an elongated thermal transfer member having opposite sides, opposite ends and a longitudinal axis extending between said ends, said member having a thermal conductivity along said axis and in a first plane transversing said sides that is substantially greater than the thermal conductivity of said member in a second plane transverse to the first plane, and a heat sink structure including a first heat sink contacting at least one side of the thermal transfer member along the length thereof, said heat sink extending from the thermal transfer member in a direction parallel to said first plane, said heat sink having a plurality of fins extending therefrom in a direction parallel to the second plane.

2. The apparatus defined in claim 1 wherein the thermal transfer member comprises a highly oriented pyrolytic graphite body composed of a plurality of thermally anisotropic graphene layers that extend parallel to said first plane, said layers having opposite side edges which collectively form the opposite sides of the thermal transfer member.

3. The apparatus defined in claim 1 and further including a compression device compressing the thermal transfer member and the heat sink together to establish intimate thermal contact therebetween.

4. The apparatus defined in claim 1 wherein the heat sink structure provides a window enabling a heat source to be seated against the other side of the thermal transfer member.

5. The apparatus defined in claim 4 and further including a heat source seated against the other side of the thermal transfer member exposed in said window, and a fastening device pressing the heat source against the other side of the thermal transfer member in said window to establish intimate thermal contact therebetween.

6. The apparatus defined in claim 5 wherein the heat source comprises a solid state device selected from a group consisting of light emitting diode die, laser die and integrated circuit die.

7. The apparatus defined in claim 1 wherein the heat sink structure includes a second heat sink contacting the other side of the thermal transfer member along the length thereof, and further including a compression device that compresses the thermal transfer member between said first and second heat sinks to establish intimate thermal contact therebetween.

8. The apparatus defined in claim 7 wherein said heat sink structure provides a window enabling a heat source to be seated against one end of the thermal transfer member.

9. The apparatus defined in claim 8 and further including the heat source seated against said one end of the thermal transfer member, and a resilient device for pressing the heat source and thermal transfer member together axially to establish intimate thermal contact therebetween.

10. The apparatus defined in claim 9 wherein the heat source comprises a solid state device selected from the group consisting of a light emitting diode die, laser die, integrated circuit die.

11. The apparatus defined in claim 1 wherein the heat sink comprises a channel supporting the thermal transfer member and being in contact with said one side thereof;

a plate having opposite faces and extending from the channel parallel to said first plane, and a plurality of spaced-apart fins projecting from said faces.

12. The apparatus defined in claim 11 wherein said channel, plate and fins constitute a unitary extruded or molded thermally conductive part.

13. The apparatus defined in claim 11 wherein said channel and plate constitute a unitary extruded or molded thermally conductive part and said fins are constituted by corrugated conductive sheets secured to the opposite faces of the plate.

14. The apparatus defined in claim 1 wherein said heat sink structure includes a second, complementary, heat sink secured to the first heat sink so as to encase the thermal transfer member therebetween.

15. The apparatus defined in claim 14 and further including a heat source contacting an end of the thermal transfer member, and a resilient device for axially pressing together the heat source and member to establish intimate thermal contact therebetween.

16. The apparatus defined in claim 15 wherein the heat sink structure has a width along said axis that is substantially equal to its depth along said first plane so as to give said apparatus a compact, substantially low profile form factor.

17. The apparatus defined in claim 15 in which the heat sink structure has a width along said second axis that is substantially greater than its depth along said first plane so as to give the apparatus a compact, substantially axial form factor.

18. The apparatus defined in claim 14 and further including an external housing comprising first and second complementary housing components that are secured together so as to encase the thermal transfer member and the heat sink structure therebetween.

19. The apparatus defined in claim 18 and further including compression fasteners for securing said first and second housing components together and maintaining a compression load on said housing components parallel to said first plane.

20. The apparatus defined in claim 1 and further including a fan for circulating air past the heat sink structure.

21. The apparatus defined in claim 1 wherein the thermal transfer member has the general shape of a rectangular parallelepiped.

22. The apparatus defined in claim 1 wherein said thermal transfer member is of a material that is conformable to the heat sink in contact therewith.

* * * * *

UNITED STATES PATENT AND TRADEMARK OFFICE

CERTIFICATE OF CORRECTION

PATENT NO. : 8,934,248 B2
APPLICATION NO. : 13/124593
DATED : January 13, 2015
INVENTOR(S) : John E. Thrailkill It is certified that error appears in the above-identified patent and that said Letters Patent is hereby corrected as shown below:

In the Specification:

In Col. 2, line 39 should read as follows:
graphene layers having edges and extending parallel to the In Col. 3, line 11 should read as follows:
heat sink structure (transversely mounted to that member)

In Col. 4, line 61 should read as follows:
sink structure fully assembled.

In Col. 6, line 52 should read as follows:
of the channel 3a with upper and lower flanges 12a, 12a of In Col. 8, line 46 should read as follows:
the Z axis, as seen in FIG. 13) is critical to the efficient In Col. 9, line 66 should read as follows:
37 and the low profile outer folded-fin component 36. This Signed and Sealed this
Second Day of June, 2015

Michelle K. Lee
*Director of the United States Patent and Trademark Office*